(12) United States Patent
Divakaruni et al.

(10) Patent No.: US 6,214,686 B1
(45) Date of Patent: Apr. 10, 2001

(54) SPATIALLY OFFSET DEEP TRENCHES FOR HIGH DENSITY DRAMS

(75) Inventors: Ramachandra Divakaruni, Middletown; Gary B. Bronner, Stormville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/388,170

(22) Filed: Sep. 1, 1999

(51) Int. Cl.[7] ................................................ H01L 21/20
(52) U.S. Cl. ............................................. 438/386; 438/386
(58) Field of Search ............................. 438/243, 386, 438/706, 736, 738, 389, 390, 700, 733, 734, 713

(56) References Cited

U.S. PATENT DOCUMENTS

| | | |
|---|---|---|
| 4,502,913 | 3/1985 | Lechaton et al. |
| 5,336,912 * | 8/1994 | Ohtsuki .................................. 257/304 |
| 5,629,226 * | 5/1997 | Ohtsuki .................................. 438/389 |
| 5,656,535 | 8/1997 | Ho et al. |
| 5,891,807 * | 4/1999 | Muller et al. ......................... 438/713 |
| 6,071,823 * | 6/2000 | Hung et al. ........................... 438/714 |

* cited by examiner

Primary Examiner—David Nelms
Assistant Examiner—David Nhu
(74) Attorney, Agent, or Firm—Venable, Baetjer, Howard & Civiletti, LLP; Andrew C. Aitken; Daryl K. Neff

(57) ABSTRACT

A method of forming spatially offset storage nodes for deep trench-based DRAMs on a semiconductor substrate. The method involves etching trenches in the surface of the substrate, masking adjacent trenches with a resist material, etching exposed trenches to a depth of about 1 micron. Removing the masking and etching all the trenches to form bulbous regions in the sidewall of the trenches. The adjacent trenches having vertically spaced bulbous regions are filled with dielectric material to form high capacitance storage nodes.

18 Claims, 3 Drawing Sheets

SPATIALLY OFFSET DEEP TRENCHES FOR HIGH DENSITY DRAMS

BACKGROUND OF THE INVENTION

1. Field of the Invention

The present invention relates generally to semiconductor memory devices and methods of manufacturing the same, and more particularly, to a method and device structure for forming storage nodes for a one transistor, one capacitor memory cell.

2. Description of the Related Art

As the capacity of semiconductor memory devices such as dynamic random access memories (DRAMs) is increased, various ways have been proposed to increase the integration density of memory cells. A one transistor, one capacitor cell structure is generally used for DRAMs. The one transistor, one capacitor cell is most suitable for high integration since the memory cell is formed by a small number of elements. Various types of capacitor structures for DRAMs are known, such as planar structures, stack structures and buried plate type trench capacitors. The desire is to obtain a large amount of memory capacitance using as small of a planar area on an integrated circuit substrate as possible.

A memory cell of a buried plate type DRAM is an example of an arrangement in which a storage capacitance is formed 3-dimensionally. In such a memory cell, a deep trench is formed in a silicon substrate in a direction perpendicular to the main semiconductor device thereof and the memory capacitor is formed on the sidewall of the trench. Therefore, the cell area can be smaller as compared to the planar capacitor type DRAM. Such deep trench based storage devices are typically etched up to 8 microns deep into the silicon. The process used for forming the deep trenches may differ between various memory sizes such as 4 megabits, 16 megabits, 256 megabits and 1 gigabit DRAM arrays. However, there are a given number of process steps that are common to each generation of DRAM cells. The commonly performed deep trench processing steps which constitute a large portion of the cost of making each of these trench-based cells are as follows: the etching of the deep trench, the formation of the initial node dielectric followed by low pressure chemical vapor deposition (LPCVD) of silicon nitride, the reoxidation of the node dielectric, the deposition of a first polysilicon fill using LPCVD, the chemical mechanical polish of the first polysilicon fill, the etching of a first recess in the first polysilicon fill using reactive ion etching (RIE), the deposition of a collar oxide, the etching of the collar oxide using RIE, the deposition of a second polysilicon fill using LPCVD, and a chemical mechanical polish of the second polysilicon fill. The method for forming a storage node for deep trench-based DRAM is disclosed in U.S. Pat. No. 5,656,535, issued Aug. 12, 1997 to Ho et al., the teachings of which are fully incorporated herein by reference.

Recent innovations in trench cell formation include the formation of a buried plate to reduce the voltage dropped across the node dielectric. This allows the use of a nitride-oxide (NO) dielectric node which are typically used for 256 Mb DRAMs.

Advanced 256 Mb and 1 Gbit trench cells also use a LOCOS collar (instead of the conventional collar process described above) which facilitates trench enhancement below the LOCOS collar and a self aligned buried plate. This technique is disclosed in the above referenced U.S. Pat. No. 5,656,535, the teachings of which are herein incorporated by reference.

In addition, even when using memory cell layouts that are designed to be below the conventional eight times the minimum full lithographic feature ($8F^2$) in square area, it is necessary to maximize the storage node capacitance for each subsequent lithography generation. In order to facilitate this need for increased capacitance, the present invention teaches a method to form spatially offset deep trenches which are compatible with all previous techniques for trench capacitance enhancement.

SUMMARY OF THE INVENTION

The present invention is a method of fabricating a storage node for a deep trench DRAM on a semiconductor substrate. The method comprises etching a trench into a silicon substrate, then etching an adjacent trench into the substrate at a different depth and then forming bottle shaped enlargements within the trenches at vertically spaced offsets for adjacent trenches. A masking step is used to block initial trench etching for adjacent trenches to obtain different starting depth for formation of the bulbuous regions within the trenches. One or more bulbous enlargements may be formed within the vertical trench to obtain large capacitance nodes within a minimum memory cell area.

BRIEF DESCRIPTION OF THE DRAWINGS

The foregoing and other objects, aspects and advantages will be better understood from the following detailed description of a preferred embodiment of the invention with reference to the drawings, wherein.

DETAILED DESCRIPTION OF THE PREFERRED EMBODIMENTS

Figure 1:
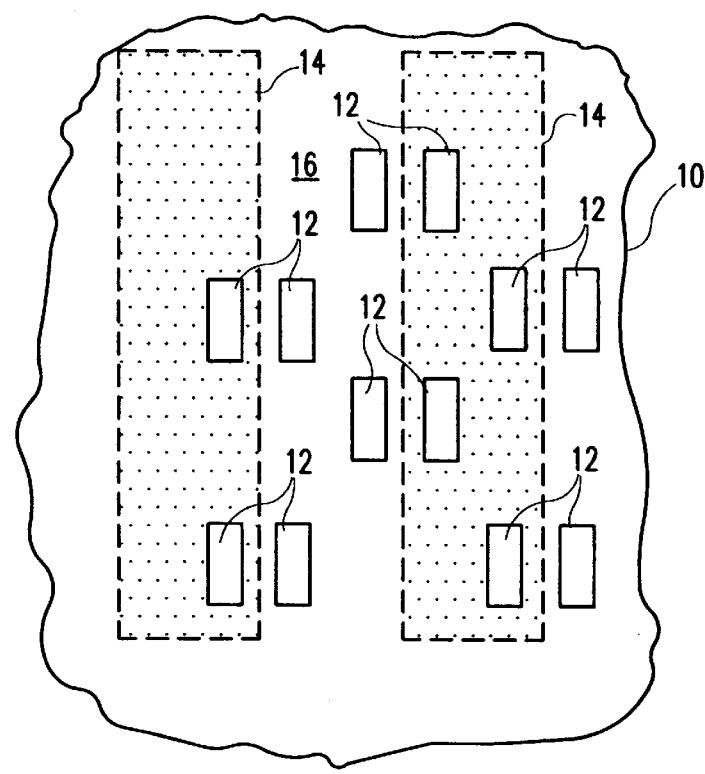
FIG. 1 is a top view of the placement for trenches on the surface of a semiconductor device for a typical $8F^2$ layout.

The present invention describes a method for spatially offsetting high capacitance, deep trenches for high density DRAMs. Referring to FIG. 1 there is illustrated a top view of a semiconductor surface 10 wherein openings for deep trenches 12 are shown lithographically placed in arrays on the surface of the semiconductor 10 for a conventional $8F^2$ layout. Covering adjacent trench row openings is a resist mask 14 which can be patterned by a critical i-line mask rather than a deep UV mask. The region 16 between the dashed lines of the lithographic mask are not covered with a resist material in a pattern to be etched.

Figure 2:
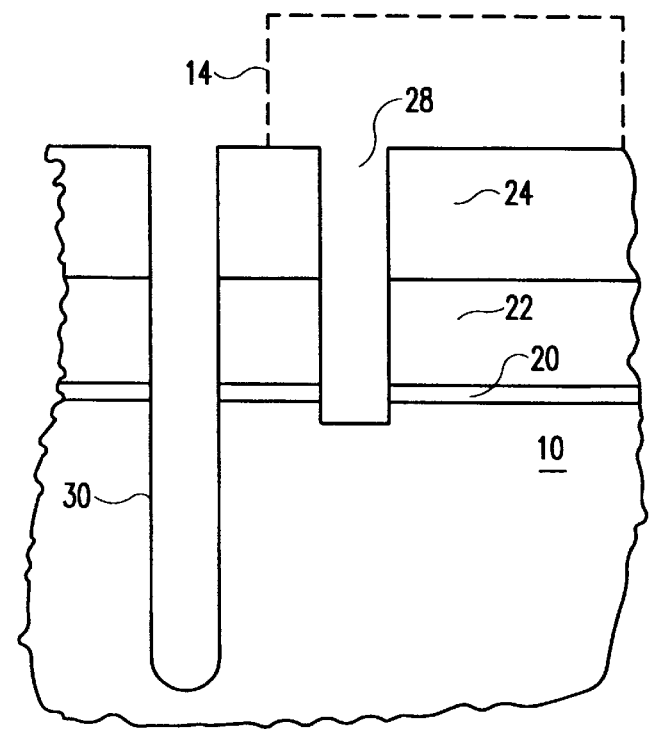
FIG. 2 is a cross sectional view through a deep trench of a DRAM after deposition of the masking layers and the initial offset etch.

Illustrated in FIG. 2 is a cross sectional view of the deep trench formation on the silicon substrate 10 which has an thin initial oxide 20 of about 50 Angstroms grown on the silicon substrate. Deposited on the thin oxide 20 is a layer of silicon nitride 22. The layer 22, needs to be thick enough for subsequent processing (in a range of about 500 Angstroms to about 2000 Angstroms). On top of the silicon nitride layer is deposited a conformal coating of borosilicate glass 24 (about 1 micron thick). The oxide/silicon nitride/borosilicate glass structure, (collectively called pad films), form a hardmask. Trench openings 28, are etched by standard etching techniques such a plasma etching or RIE through the borosilicate glass 24, the silicon nitride 22, and the initial oxide 20, into the silicon substrate 10. Once the trench openings 28, are made through the pad films, a resist mask 14, is patterned over adjacent trench openings 28. As shown in FIG. 1 the resist mask 14, can be patterned in a non-critical alignment manner to cover adjacent trench openings 28.

Using an etching technique, such as RIE, a trench 30 is etched to a depth deeper than the adjacent trench 28 which is masked. The depth of trench 30 is typically made 1 micron or more deeper than the adjacent trench 28. The resist mask 14 is then removed.

Figure 3:
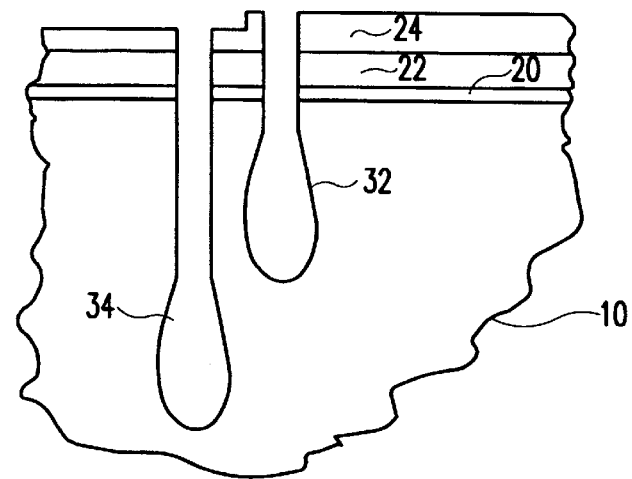
FIG. 3 is a cross sectional view of the formation of the trench.

After removal of the resist layer 14, etching is continued. To make the bottled shaped enlargement within the trench, the etchant is changed from anisotropic to isotropic for a length of time to form the bulbous enlargements 32 and 34 shown in FIG. 3.

Figure 4:
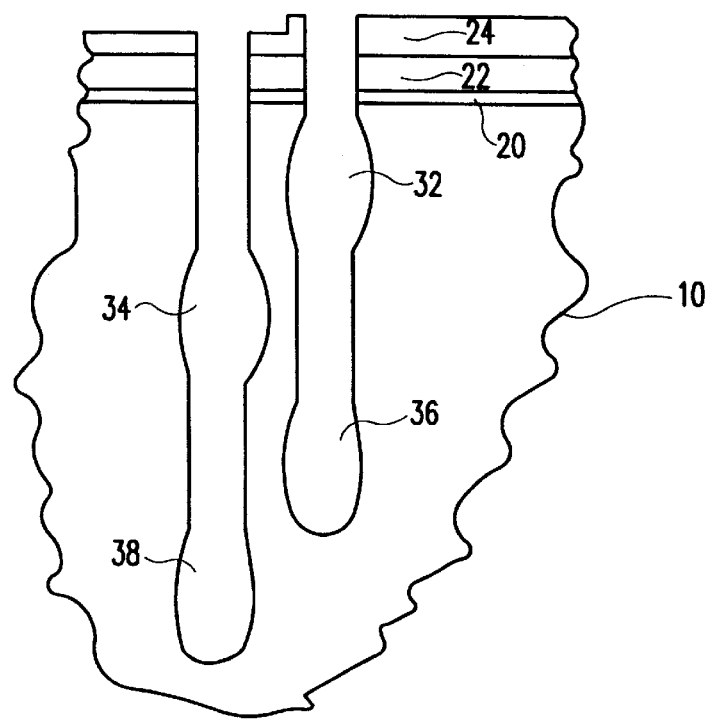
FIG. 4 is a cross sectional view of an alternative embodiment of the present invention having multiple bottle-shaped enlargements within a trench.

Multiple bulbulous regions, 36 and 38, for example, can be formed within the trenches to increase capacitance as shown in FIG. 4. Note that adjacent trench regions never touch. Therefore, there is no shorting between memory cells formed by the one transistor, one capacitor device memory cell structures. Large storage node capacitance for a memory cell can be gained by the formation of bottle trenches and multiple bottle shaped trenches spatially offset in the vertical dimension.

Figure 5:
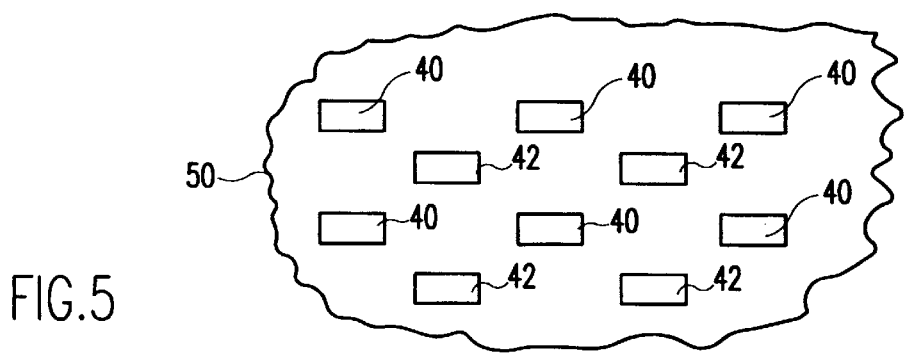
FIG. 5 is a top view of an alternate embodiment for trench openings in a lithography layer.
Figure 6:
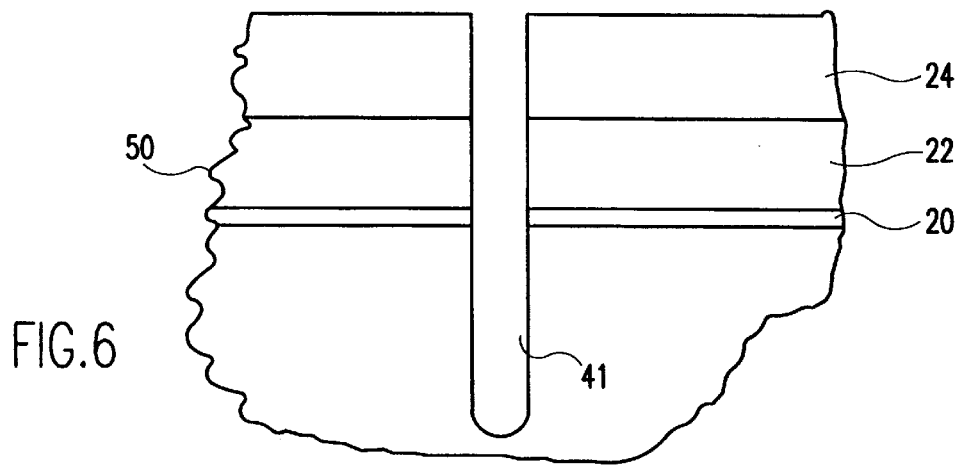
FIG. 6 is a cross sectional view of an alternate trench formation.

An additional embodiment of this invention is to lithographically pattern adjacent trenches in separate steps to create an offset etch between closest adjacent trenches. This is particularly suited to sub $8F^2$ layouts such as illustrated in FIG. 5. As shown in FIG. 5, trenches 40 would first be printed on a substrate 50 containing pad films. After the pad films are opened, offset trenches 41, are etched by standard etching techniques resulting in a trench as shown in FIG. 6. The resist mask (not shown) is then removed and a separate printing step is used to open the pad films of trenches 42.

Figure 7:
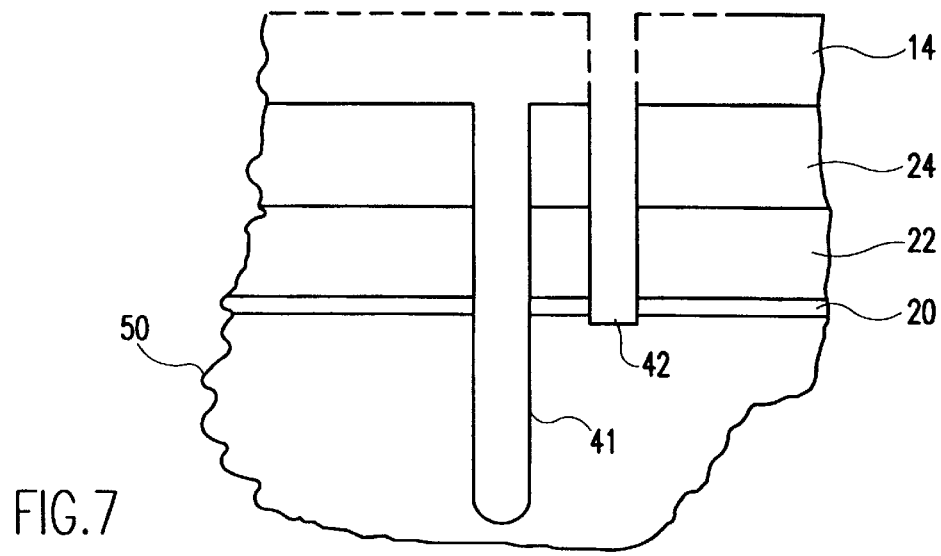
FIG. 7 is a cross sectional view of a trench formation with resist masking.

It is thus possible to pattern only the trenches 40 (or 42) shown in FIG. 5, and perform the mask opening and offset etch as shown in FIG. 6. Following an etch of the trench 41, the trench 41, may be filled up with a resist which may be a multilayer resist used to pattern trenches marked 42 (or 40). The resist 14, may be left in trench 41, while the pad films are etched to the silicon surface to form the trench opening 42 (or 40) as shown in FIG. 7. In this case, the masking resist layer 14 is used to define the adjacent trench and is a critical lithography step with critical overlay. It is easy to see the resulting structure is the same as that shown in FIG. 2 of the earlier embodiments.

Having thus described the present invention and its preferred embodiments in detail, it will be readily apparent to those skilled in the art that further modifications to the invention may be made without departing from the spirit and scope of the invention as presently claimed.

What is claimed is:

1. A method of fabricating capacitive storage nodes for one transistor, one capacitor cell dynamic random access memories (DRAMs) on a semiconductor substrate comprising;

forming masking layers on a semiconductor substrate;

etching openings through said masking layers to the surface of said semiconductor substrate to form trenches;

masking one trench of adjacent said trenches with at least one semiconductor etch resistant material;

removing a portion of the semiconductor substrate at the bottom of the other of said adjacent trenches to a depth below the bottom of said one trench;

removing said semiconductor etch resistant material over said one trench; and etching said trenches isotropically to form bulbous enlargements within said trenches such that a bulbous enlargement etched in said one trench is at a different depth from a bulbous enlargement etched in said other trench.

2. The method of claim 1, wherein adjacent trenches have bulbuous enlargements offset in a vertical direction from the surface of said semiconductor substrate.

3. The method of claim 1, wherein said masking layers are at least one layer of silicon oxide, at least one layer of silicon nitride, and at least one layer of borosilicate glass.

4. The method of claim 1, wherein said semiconductor etch resistant material is a photoresist material.

5. The method of claim 1, wherein said adjacent trenches are etched to a depth of at least about 1 micron.

6. The method of claim 1, wherein said trench depth is at least about 8 microns.

7. A method of fabricating capacitive storage nodes for one transistor, one capacitor cell dynamic random access memories (DRAMs) on a semiconductor substrate comprising:

forming masking layers on a semiconductor substrate;

patterning a first set of trenches with an etch resistant material on said layers to form a first etch resistant mask;

etching said first set of trenches through said masking layers to a depth below the surface of said semiconductor substrate;

removing said first etch resistant mask;

patterning a second set of trenches adjacent to said first set of trenches with an etch resistant material on said masking layers to form a second etch resistant mask;

etching said second set of trenches through said masking layers into the said semiconductor substrate;

removing said second etch resistant mask;

and etching the first and second sets of trenches isotropically to form bulbous enlargements within the trenches such that bulbous enlargements etched in said first set of trenches are at a different depth from bulbous enlargements etched in said second set of trenches.

8. The method of claim 7, wherein adjacent trenches have bulbous enlargements offset in a vertical direction from the surface of said semiconductor substrate.

9. The method of claim 7, wherein said masking layers are at least one layer of silicon oxide, at least one layer of silicon nitride and at least one layer of borosilicate glass.

10. The method of claim 7, wherein said etch resistant material is a photoresist material.

11. The method of claim 7, wherein said etch resistant material is a multilayer photoresist which protects said first set of trenches during etching of said second set of trenches.

12. The method of claim 7, wherein said first set of trenches are etched to at least about 1 micron below the surface of the semiconductor substrate.

13. A dynamic random access memory comprising an array of one transistor one capacitor memory cells formed on a semiconductor substrate, the capacitor comprising a dielectric filled trench having one or more bulbous enlargements spatially offset in a vertical direction from a surface of the semiconductor substrate from bulbous enlargements of adjacent trenches.

14. The dynamic random access memory of claim 13, wherein the depth of said trench is at least about 8 microns.

15. The dynamic random access memory of claim 13, wherein the bulbuous enlargements are spatially offset in a vertical direction from bulbuous enlargements in adjacent trenches at least about 1 micron.

16. The dynamic random access memory of claim 13, wherein the trenches are patterned using at least one layer of silicon oxide, at least one layer of silicon nitride, and at least one layer of borosilicate glass.

17. The method of claim 1, wherein the bulbous enlargements are isotropically etched at the bottoms of the respective adjacent trenches.

18. The method of claim 7, wherein the bulbous enlargements are isotropically etched at the bottom of the respective adjacent trenches.

* * * * *